(12) United States Patent
Tsironis

(10) Patent No.: US 10,725,094 B1
(45) Date of Patent: Jul. 28, 2020

(54) ACTIVE ELECTRONIC TUNER

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 68 days.

(21) Appl. No.: 16/151,838

(22) Filed: Oct. 4, 2018

Related U.S. Application Data

(60) Provisional application No. 62/568,481, filed on Oct. 5, 2017.

(51) Int. Cl.

| | |
|---|---|
| *G01R 31/28* | (2006.01) |
| *G01R 31/26* | (2020.01) |
| *G01R 31/319* | (2006.01) |
| *H01P 5/04* | (2006.01) |
| *H03H 11/30* | (2006.01) |
| *G01R 27/32* | (2006.01) |
| *H03H 7/12* | (2006.01) |
| *H03F 3/195* | (2006.01) |
| *H01P 1/15* | (2006.01) |

(52) U.S. Cl.
CPC ......... *G01R 31/2822* (2013.01); *G01R 27/32* (2013.01); *G01R 31/2607* (2013.01); *G01R 31/31905* (2013.01); *H01P 5/04* (2013.01); *H03H 11/30* (2013.01); *H01P 1/15* (2013.01); *H03F 3/195* (2013.01); *H03H 7/12* (2013.01)

(58) Field of Classification Search
CPC .... G01R 31/00; G01R 31/26; G01R 31/2607; G01R 31/28; G01R 31/282; G01R 31/2822; G01R 31/317; G01R 31/3181; G01R 31/319; G01R 31/31903; G01R 31/31905; G01R 27/00; G01R 27/28; G01R 27/32; H03H 11/00; H03H 11/02; H03H 11/28; H03H 11/30; H03H 7/00; H03H 7/01; H03H 7/12; H01P 5/00; H01P 5/04; H01P 1/00; H01P 1/10; H01P 1/15; H03F 3/00; H03F 3/189; H03F 3/19; H03F 3/195
USPC ......... 324/600, 601, 74, 130, 202, 500, 537, 324/750.01, 750.02; 702/85; 340/501, 340/870.04
See application file for complete search history.

(56) References Cited

U.S. PATENT DOCUMENTS

| | | | |
|---|---|---|---|
| 5,034,708 A | 7/1991 | Adamian et al. | |
| 7,282,926 B1 | 10/2007 | Verspecht et al. | |
| 8,497,689 B1 * | 7/2013 | Tsironis | G01R 27/32 324/637 |
| 9,331,670 B1 | 5/2016 | Mahmoudi et al. | |
| 9,660,607 B2 | 5/2017 | Boudiaf et al. | |
| 9,960,472 B1 * | 5/2018 | Tsironis | H01P 5/04 |
| 10,103,713 B1 * | 10/2018 | Tsironis | H03H 11/30 |
| 10,177,428 B1 * | 1/2019 | Tsironis | H01P 1/182 |
| 10,276,910 B1 * | 4/2019 | Tsironis | H01P 5/183 |
| 10,317,445 B1 * | 6/2019 | Tsironis | G01R 27/28 |

(Continued)

OTHER PUBLICATIONS

"High resolution tuners eliminate load pull performance errors", Application Note 15, Focus Microwaves, Jan. 1995, pp. 6 and 7.

(Continued)

*Primary Examiner* — Hoai-An D. Nguyen

(57) ABSTRACT

An active digital electronic tuner (AET) uses a digital PIN diode electronic tuner, an adjustable directional coupler, two circulators and a power amplifier to create a compact load pull tuner device able of generating octave frequency band virtual reflection factors |Gamma|≥1 at milli-second tuning speed.

7 Claims, 10 Drawing Sheets

(56) References Cited

U.S. PATENT DOCUMENTS

| | | | | |
|---|---|---|---|---|
| 10,345,370 B1* | 7/2019 | Tsironis | ............ | G01R 31/2822 |
| 10,348,273 B1* | 7/2019 | Tsironis | .................... | H03J 1/06 |
| 10,444,266 B1* | 10/2019 | Tsironis | ............ | G01R 31/2608 |
| 10,520,541 B1* | 12/2019 | Tsironis | ................... | H03H 7/40 |

OTHER PUBLICATIONS

"PIN diodes" [online], Wikipedia, [Retrieved on Oct. 16, 2017]. Retrieved from Internet <URL: https://en.wikipedia.org/wiki/PIN_diode>.

Y. Takayama, "A new load-pull characterization method for microwave power transistors", 1976 IEEE Microwave Theory & Techniques Society (MTT-S) International Microwave Symposium, pp. 218-220.

* cited by examiner

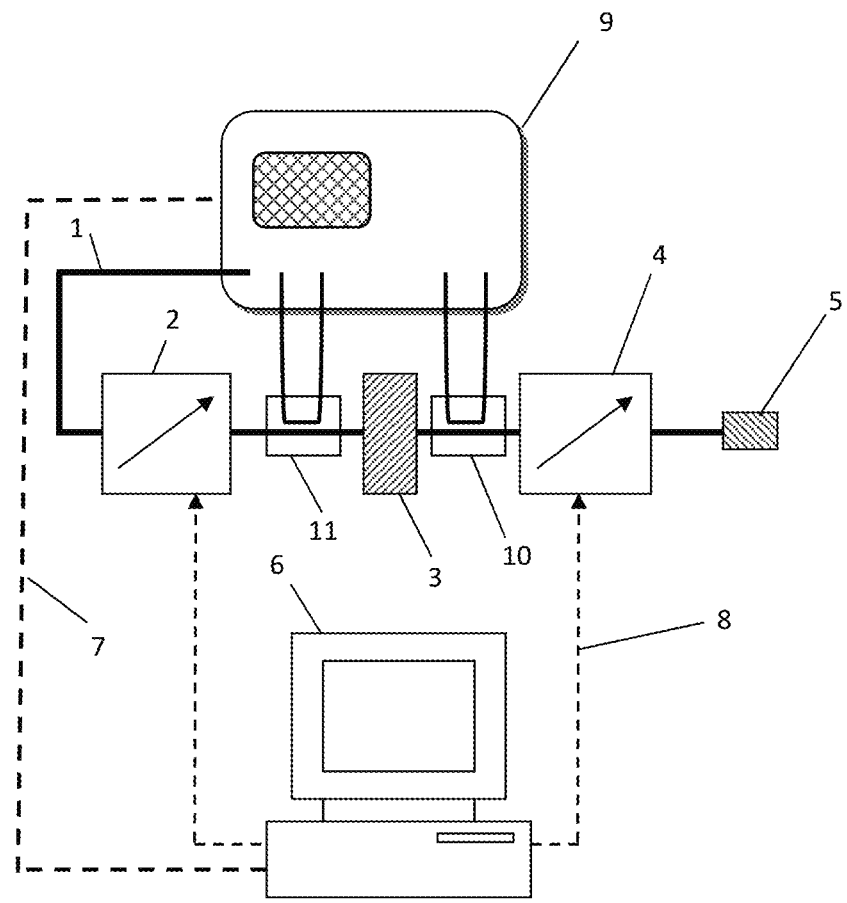
FIG. 1: Prior art

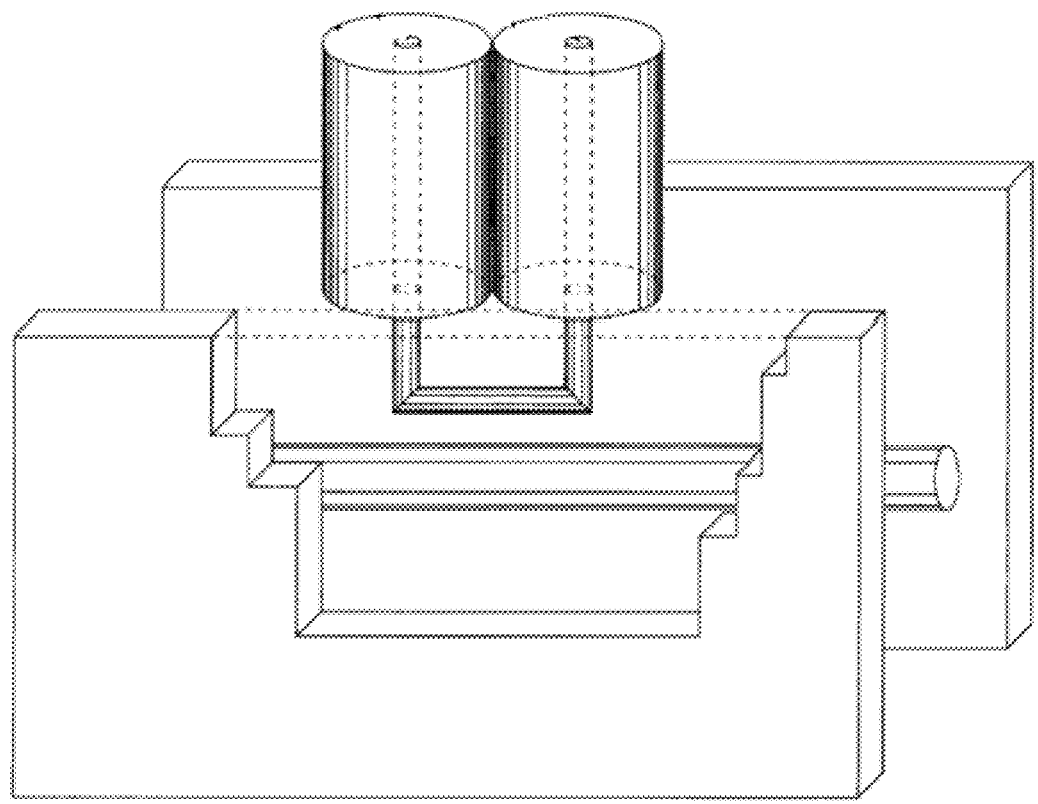
FIG. 2: Prior art

FIG. 3A: Prior art
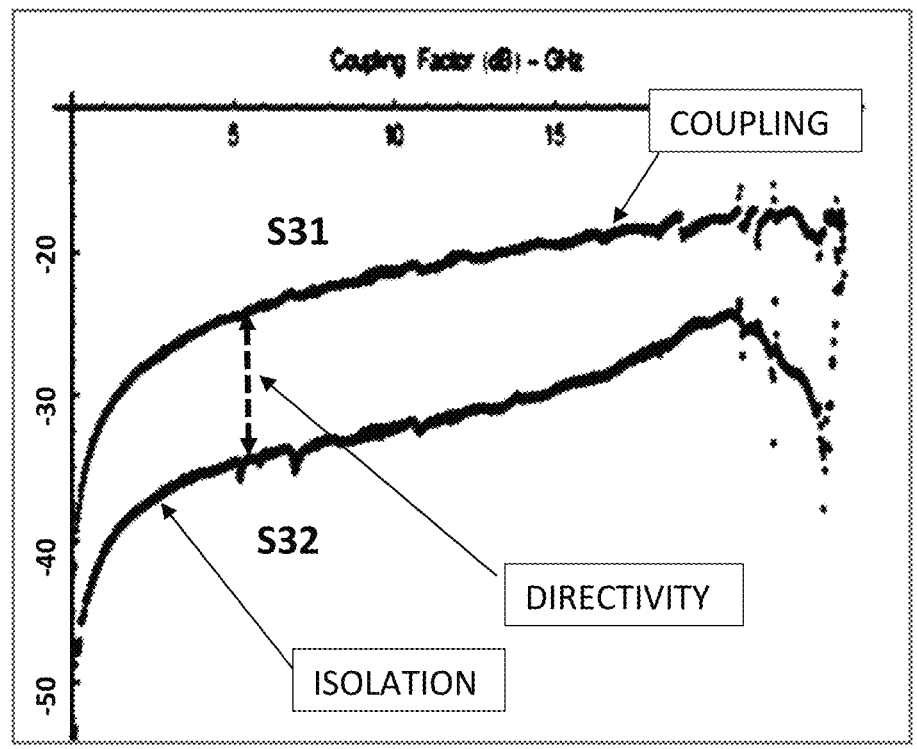
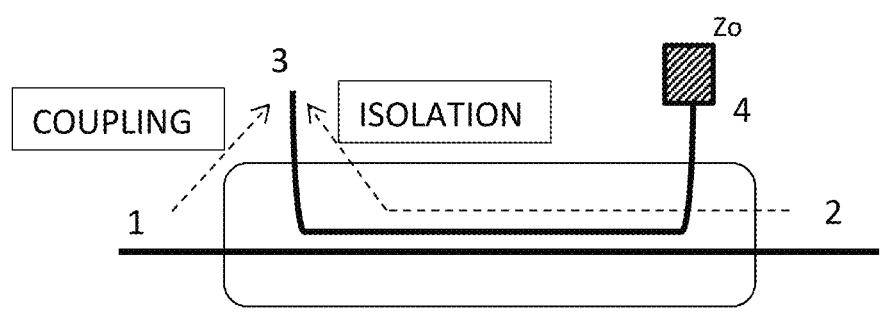
FIG. 3B: Prior art

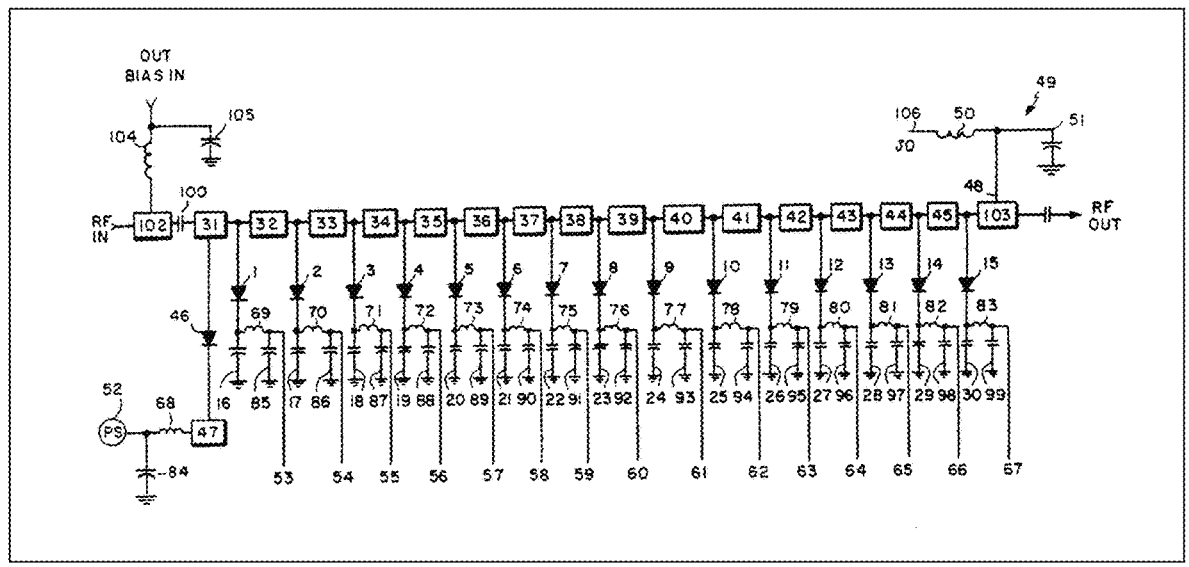
FIG. 4: Prior art

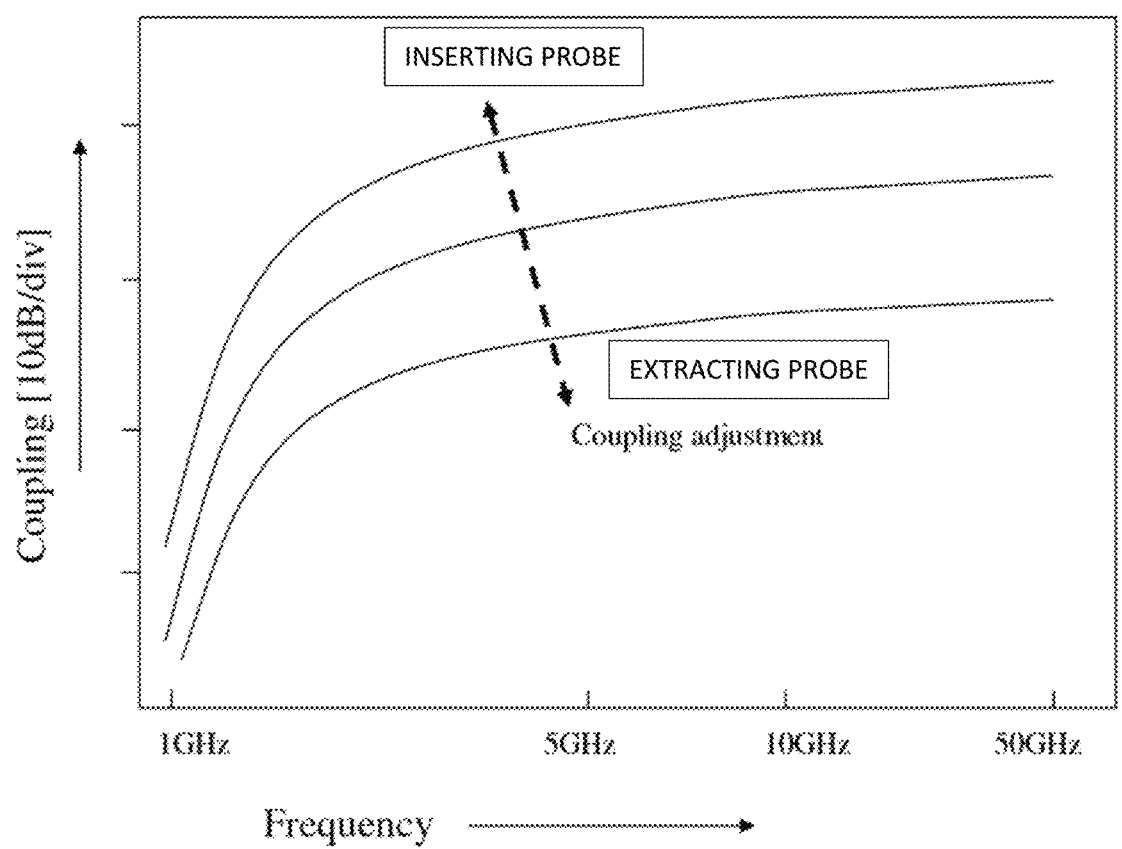
FIG. 5: Prior art

ACTIVE ELECTRONIC TUNER

PRIORITY CLAIM

This application claims priority on provisional application No. 62/568,481, filed on Oct. 5, 2017, titled "Active Electronic Tuner".

CROSS-REFERENCE TO RELATED ARTICLES

1. Mahmoudi et al., U.S. Pat. No. 9,331,670, "Gamma Boosting Unit (GBU) for Hybrid Load and Source Pull".
2. Verspecht et al., U.S. Pat. No. 7,282,926, "Method and an apparatus for characterizing a high-frequency device-under-test in a large signal impedance tuning environment".
3. "High resolution tuners eliminate load pull performance errors", Application Note 15, Focus Microwaves, January 1995, pages 6 and 7.
4. Adamian et al., U.S. Pat. No. 5,034,708, "Programmable Broadband Electronic Tuner".
5. "PIN diodes" [online], Wikipedia, [Retrieved on 2017 Oct. 16]. Retrieved from Internet <URL: https://en.wikipedia.org/wiki/PIN_diode>.
6. Boudiaf, et al., U.S. Pat. No. 9,660,607, "Solid State Impedance Tuners".
7. Y. Takayama, "A new load-pull characterization method for microwave power transistors", 1976 IEEE Microwave Theory & Techniques Society (MTT-S) International Microwave Symposium, pp. 218-220

BACKGROUND OF THE INVENTION

This invention relates to load pull testing of microwave transistors (DUT). When the transistors are driven in their nonlinear operation regime their internal output impedance is very low. An impedance tuner (see ref. 3) used to match the transistor in a load pull setup (FIG. 1) must also conjugate-match such impedance, i.e. the reflection factor presented by the tuner to the DUT must have the same amplitude and the opposite phase. The device under test (DUT) (3), is inserted between two impedance tuners (2) and (4) and signal (1) is injected from a signal source (9), which acts also as a receiver, and terminates at the load (5). The injected and reflected power waves are detected using bidirectional couplers (11) and (10) and fed into the receiver (9). The system is controlled by a PC controller (6) using tuner control (8) and data control (7) cables.

Passive impedance tuners (2), (4), see ref. 3, can reach maximum reflection factors $|\Gamma_{tuner}|$ in the order of 0.95, corresponding (in a 50Ω system) to impedances of 2.4Ω. The insertion loss, created by RF cables, test fixtures, couplers (10), (11) etc. between DUT (3) and tuners (2) and (4) reduces the available tuning range at the DUT reference plane and thus the capacity of the passive tuner to match the transistor. The only remedy to this limitation is using active systems (see ref. 1 and 7), i.e. test systems whereby a signal coherent with the signal injected into the input of the DUT, is injected into the input or output of the DUT and creates "virtual" impedance (load). This additional signal can be the only one injected, in which case we speak of purely "active" load pull, or it can be superimposed to signal reflected by a passive tuner, in which case we speak of "hybrid" load pull; obviously if only a passive (mechanical or electronic) tuner is present, i.e. a tuner not comprising an amplifier, we speak of "passive" load pull. In both active injection cases (pure active and hybrid) the objective is to reach and match the internal impedance of the transistor DUT); in general terms a standard requirement is a tuning range reaching a reflection factor |Γ|=1 at the DUT reference plane (corresponding to an internal DUT impedance of 0Ω); due to above mentioned insertion losses, however, it is necessary that, at the tuner reference plane, the generated reflection factor Γtuner shall be |Γtuner|>1.

Mechanical tuners are slow (see ref. 3). The objective of this invention is a high speed active tuner apparatus using a fast digital electronic tuner (see ref. 3 and 6), an amplifier and forward signal injection mechanism allowing $|\Gamma_{DUT}| \geq 1$. It has to be clarified at this point that "electronic" does not mean "active". Electronic tuners, as disclosed here, are passive, but not mechanical (FIGS. 4 and 10).

Passive automatic (remote controlled) tuners are either electromechanical (see ref. 3) or electronic (see ref. 4 and 6 and FIG. 4, 10). Electromechanical tuners cover high frequency bandwidth (are wideband), generate high reflection factor (F, Gamma), are linear, have high tuning resolution, but they are slow, because of mechanical movement. Electronic tuners use PIN diodes (see ref. 4, 5 and FIG. 10), and have smaller bandwidth, lower maximum reflection factor Gamma, lower linearity and resolution than mechanical tuners, but they are extremely fast (they switch states in milli-seconds versus seconds of mechanical tuners); so in essence we are talking about an increased speed ratio (or reduced tuning time) of 500 to 1000:1. For a number of applications electronic tuners, if used in active configuration, as in this invention, can yield maximum reflection factor $|\Gamma_{DUT}| \geq 1$ and can exploit their high tuning speed. And as modern test technologies evolve testing automatically a large number chips on-wafer, speed is of essence and may overcome other, comparative, weaknesses of electronic tuners.

DESCRIPTION OF PRIOR ART

There have been several attempts at active load pull systems, starting back in the 70'ies (see ref. 1 and 7). Such load pull techniques use the so called "virtual load" concept (FIG. 8). The virtual load consists in injecting into the output of the DUT RF power at the same frequency as traversing the DUT from the input to the output, but with controlled phase and amplitude. Knowing that the reflection factor "seen" by the DUT is equal to the ratio of returned (reflected) power wave <a> to primary output power wave <b>: (Γ=<a>/<b>)(FIG. 8), it is understood that by controlling the phase and amplitude of <a> for a constant <b> we can control Γ. The invention uses the capability of adjustable wave-probes (see ref. 2) to couple the signal into the electronic tuner and amplifier network and adjust the coupling factor and the phase, when properly used in a slabline-based structure.

BRIEF DESCRIPTION OF THE INVENTION

The invention combines the concept of amplitude- and phase-adjustable directional coupler (insertable wave-probe) with high speed controlled amplitude and phase transmission tuning, possible using a reflective electronic tuner in conjunction with a circulator. The reflective tuner being connected to the $2^{nd}$ port of the circulator modulates amplitude and phase of the transmission factor $S_{31}$ between $1^{st}$ and $3^{rd}$ circulator ports, which in return controls amplitude and phase of the feedback signal injected into the amplifier in the active loop. The concept is made clear in FIG. 6. The adjustability of the coupler allows controlling the amplitude and the phase of the returned signal in order to match the device internal impedance and employ the reflection states of the tuner at their optimum angle (FIG. 9).

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a load pull test system.

FIG. 2 depicts prior art, a compact signal coupler using a folded semi-rigid coaxial cable, ("wave-probe").

FIGS. 3A through 3B depict prior art, FIG. 3A depicts coupling factor, isolation and directivity data and FIG. 3B definitions of RF characteristics in a wave-probe coupler.

FIG. 4 depicts prior art (see ref. 4), basic structure of electronic tuner using PIN diodes; item numbers in this figure are not used in the specification.

FIG. 5 depicts prior art, variation of coupling factor of wave-probe when inserted into or retracted from the slabline.

DETAILED DESCRIPTION OF THE INVENTION

Figure 6:
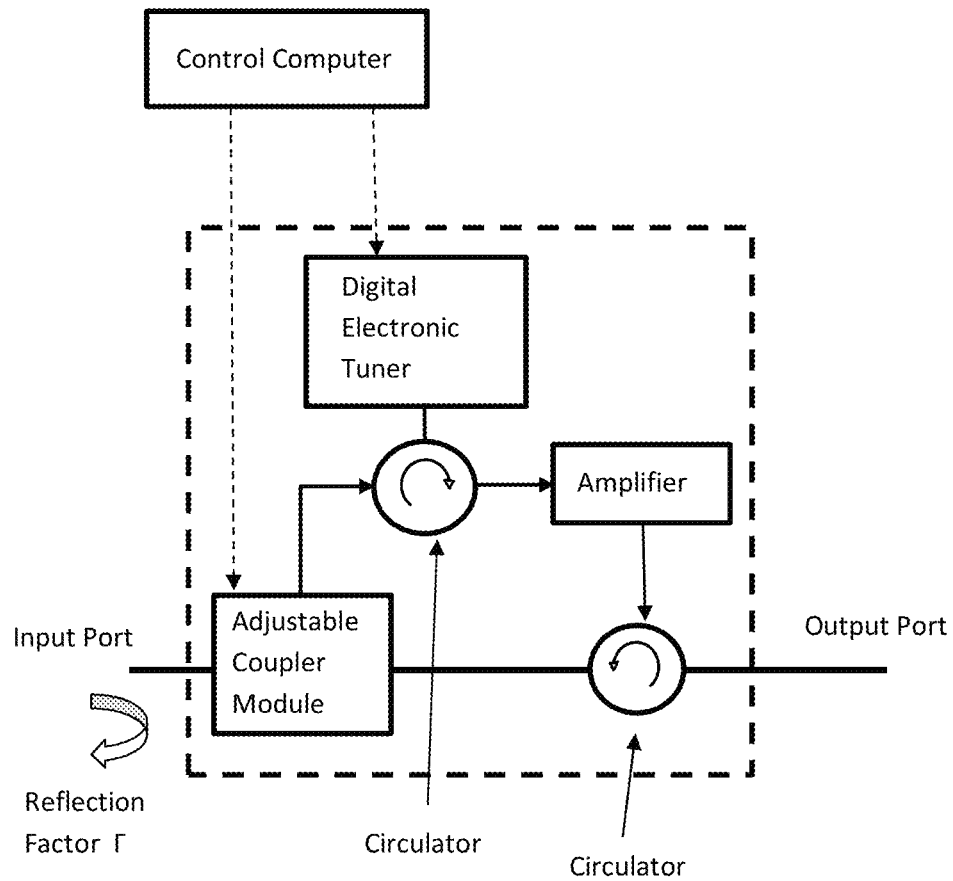
FIG. 6 depicts block diagram of Active Digital Electronic Tuner (AET) load pull tuner unit.
Figure 7:
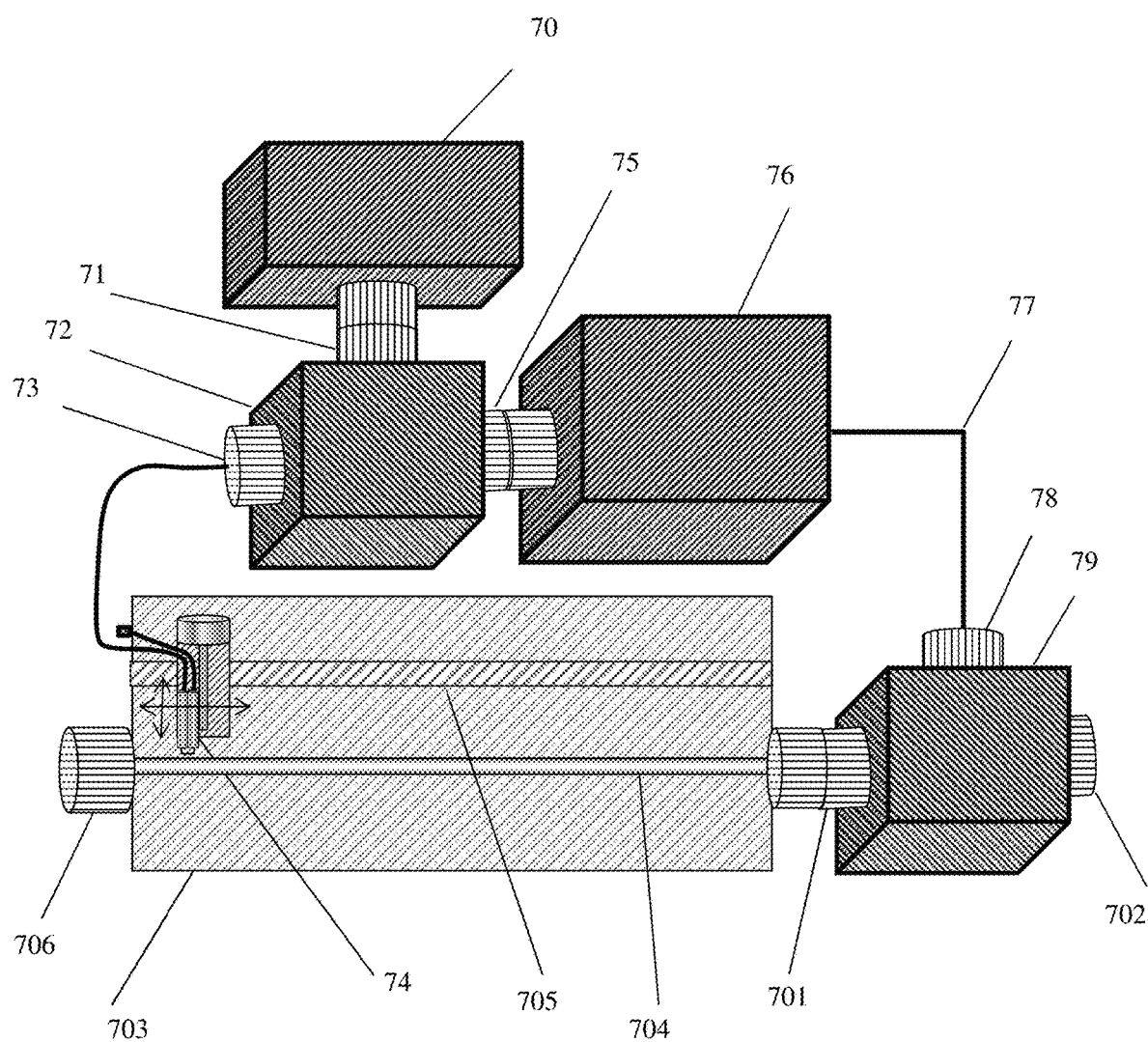
FIG. 7 depicts detailed structure of AET.

The concept of the Active Electronic Tuner (AET) is shown in FIG. 6. A realistic implementation is shown in FIG. 7. It comprises a network of (a) Adjustable Coupler Module, (b) Digital Electronic Tuner and (c) Amplifier, joined using (d) two Circulators. The adjustable coupler module is mounted in a slotted airline (slabline) which has a center conductor, an input and an output port and reaches from the input port of the tuner to the second port of an output circulator, of which the third port is the output port of the tuner. The coupler and the digital tuner are remotely controlled by a control computer. The digital electronic tuner (70) is connected to the second port (71) of a circulator (72) of which the first port (73) receives the signal sampled by the coupler (74) and the third port (75) is connected to the input port of the (power) amplifier (76). The output port (77) of the amplifier (76) is connected to the first port (78) of a second circulator (79) of which the second port (701) is connected to the output port of the slabline (703) and the third port (702) is connected to an external load (not shown). The second circulator (79) can be replaced by an isolator (a circulator of which port #3 (702) is terminated with Zo (50Ω); this 'isolator' configuration can only be used if the outgoing and reflected signals from the DUT are sampled and measured using bidirectional couplers (10) and (11) inserted between the DUT and the tuner ((4) in FIG. 1, (706) in FIG. 7).

Figure 10:
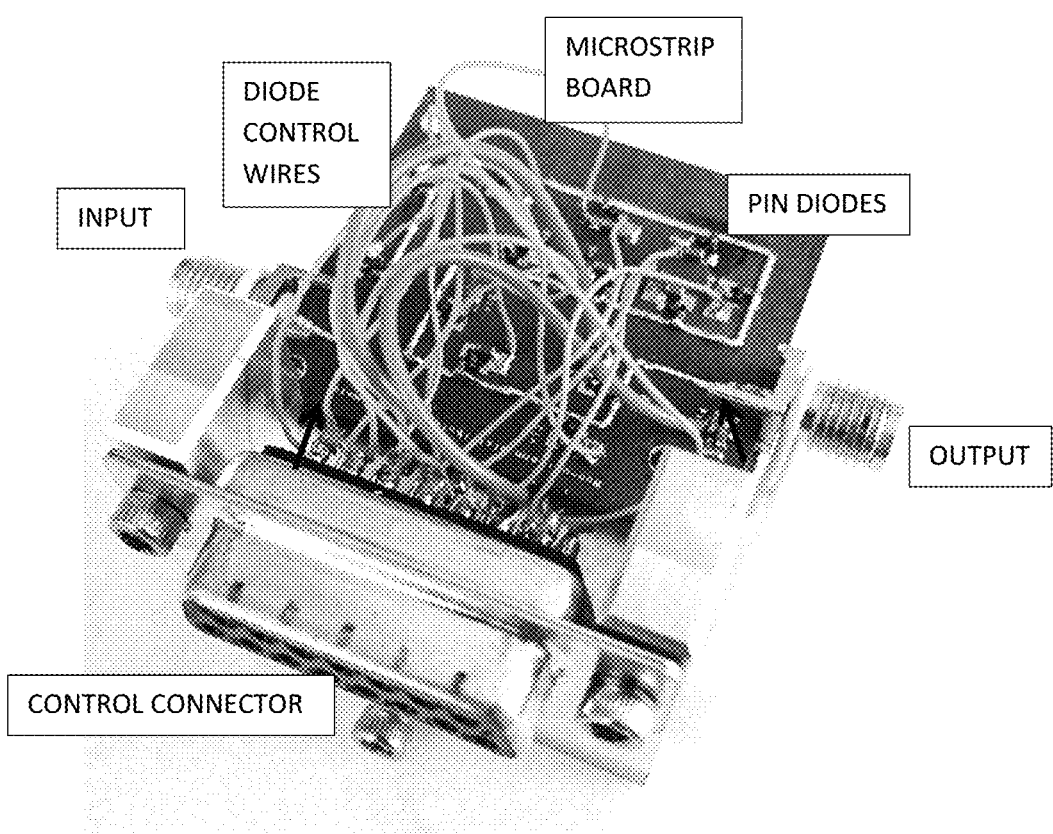
FIG. 10 depicts digital electronic tuner on microstrip using 12 PIN diodes and capable of creating $2^{12}$=4096 distinct tuner states.

The electronic tuner comprises a microstrip network in which a multitude (N>2, typically N=10 to 16) of PIN diodes (FIGS. 4 and 10) are incorporated and are controlled by an external electronic digital control board and a control computer controller (FIG. 6). The coupler (74) samples and couples energy from the center conductor (704) of the slabline (703) into the port #1 (73) of the circulator (72). The horizontal position of the coupler (74) is remotely controlled by electric stepper motor gear (705), (acme leading screw, belt or rack-and-pinion) drive. The distance of the coupling loop to the center conductor is remotely controlled by electric stepper motor driving a vertical axis.

The coupling section comprises a wave probe (74) (FIG. 2). It is adjusted to provide a coupling factor S31 (FIG. 3B) at any given frequency (FIGS. 3A and 5). The coupling factor shown in FIG. 3A varies, in this case, between −25 and −15 dB (in linear meaning that between 0.3% and 3% of the signal power is coupled into the "coupled" port, and between −40 and −30 dB (0.1% and 0.3%) are coupled into the "reverse coupled" or "isolated" port). The directivity of 15 dB is necessary in order to reduce the risk of spurious oscillations of the active loop comprising the "isolation-tuner-amplifier" path.

The signal injected into port #1 (73) of the first circulator is transferred to its second port (71). The signal is reflected at the tuner's (70) input port and is returned with modified amplitude and phase. The returned signal is transferred from port #2 (71) to port #3 (75) and injected into the input port of the amplifier (76). The amplified signal is fed (77) into the first port (78) of the second circulator and exits at the second port (701) and is injected back into the DUT through port (706), thus creating a virtual load for the DUT which is connected to port (706). Port (702) is terminated with characteristic impedance Zo (typically 50Ω).

Figure 8:
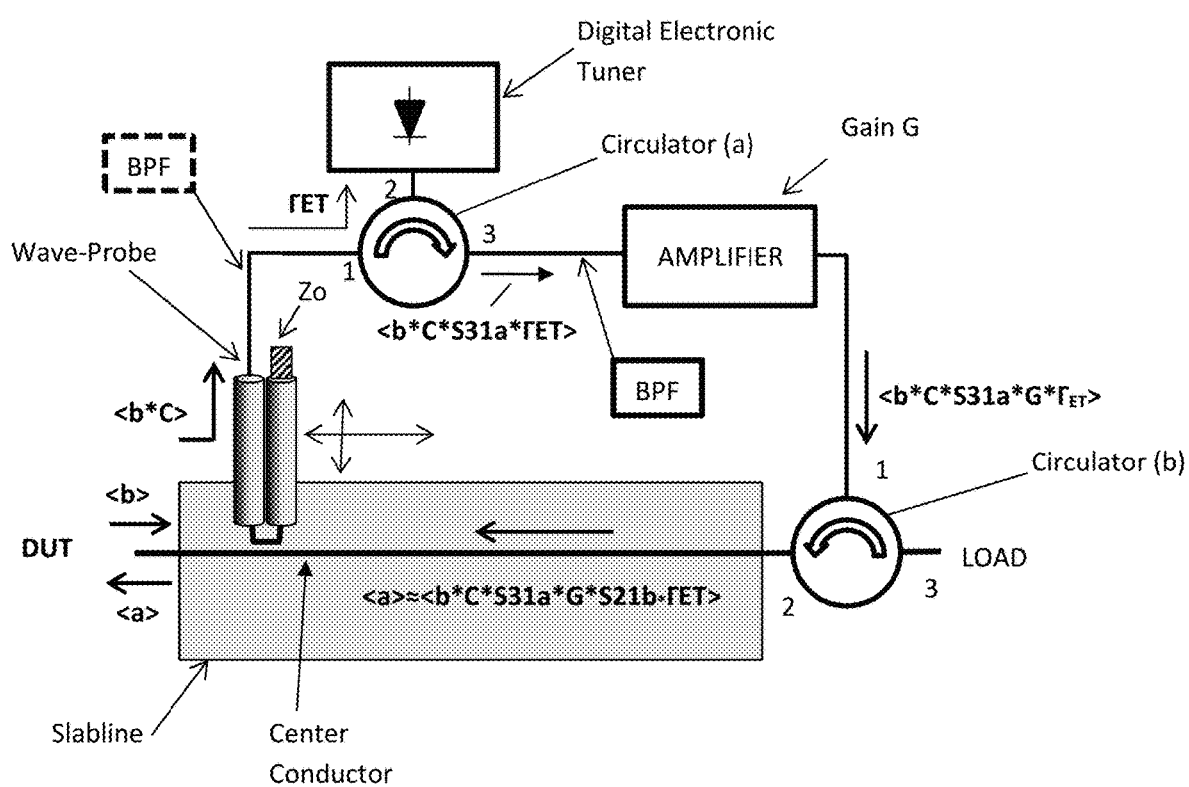
FIG. 8 depicts simplified signal flow in AET.

A representation of the signal power wave flow in the system is shown in FIG. 8: Signal power wave <b> exits from the DUT port, enters the slabline and is coupled partly (coupling factor C<<1) into the active loop: <b*C>; then it is transferred from port #1 to port #2 of circulator (a), reflected at the tuner port by the reflection factor of the electronic tuner $\Gamma_{ET}$ and transferred to port #3: <b*C*$S_{31a}$*$\Gamma_{ET}$>. Hereby the scattering parameter (s-parameter) transfers from port #1 to port #2 ($S_{21a}$) and from port #2 to port #3 ($S_{32a}$) of the circulator (a) are combined into transfer factor $S_{31a}$=$S_{21a}$*$S_{32a}$. In s-parameter nomenclature $S_{xy}$ describes the signal transfer from port "y" to port "x" in a 50 Ohm system (source and load impedances are 50 Ohm). If the source or load impedances change, s-parameters are duly transformed using existing relations. The amplified signal power wave <b*C*$S_{31a}$*G*$\Gamma_{ET}$> is then transferred from port #1 to port #2 of circulator (b) and injected into the output port of the slabline in direction of the DUT: <a>≈<b*C*$S_{31a}$*G*$\Gamma_{ET}$*$S_{21b}$>. This creates a virtual reflection factor of approximately $\Gamma_{LOAD}$=<a>/<b>≈C*$S_{31a}$*G*$\Gamma_{ET}$*$S_{21b}$. Assuming transmission factors between ports of the circulators are similar in size, then the previous relation can be approximated to $\Gamma_{LOAD}$≈C*$S_{21a}^3$*G*$\Gamma_{ET}$. Transmission factor amplitudes are typically −0.1 dB or ≈0.99 and coupling factors are C≈0.01, in which case $\Gamma_{LOAD}$ becomes equal to 1 for a gain G≥100 or 20 dB. This is an easily obtainable value for a power amplifier. It will, therefore, be relatively easy to manufacture, in praxis, active high-speed tuners using this method.

The phase adjustability of the coupling section is beneficial in two ways: (i) in order to rotate and focus the tuning states close to and around the conjugate complex impedance of the DUT and (ii) in order to suppress spurious oscillations of the loop by changing the transmission phase of the loop. It is possible that spontaneous spurious oscillations occur at frequencies outside the scope of the investigation, starting out of background noise, and in-order to avoid this, a band-pass filter (BPF) can be inserted in the active loop between port #3 of circulator (a) and the amplifier or between the coupled port of the coupler and port #1 of circulator (a), (FIG. 8), without, otherwise, changing the basic operation and the scope of the invention.

Figure 9:
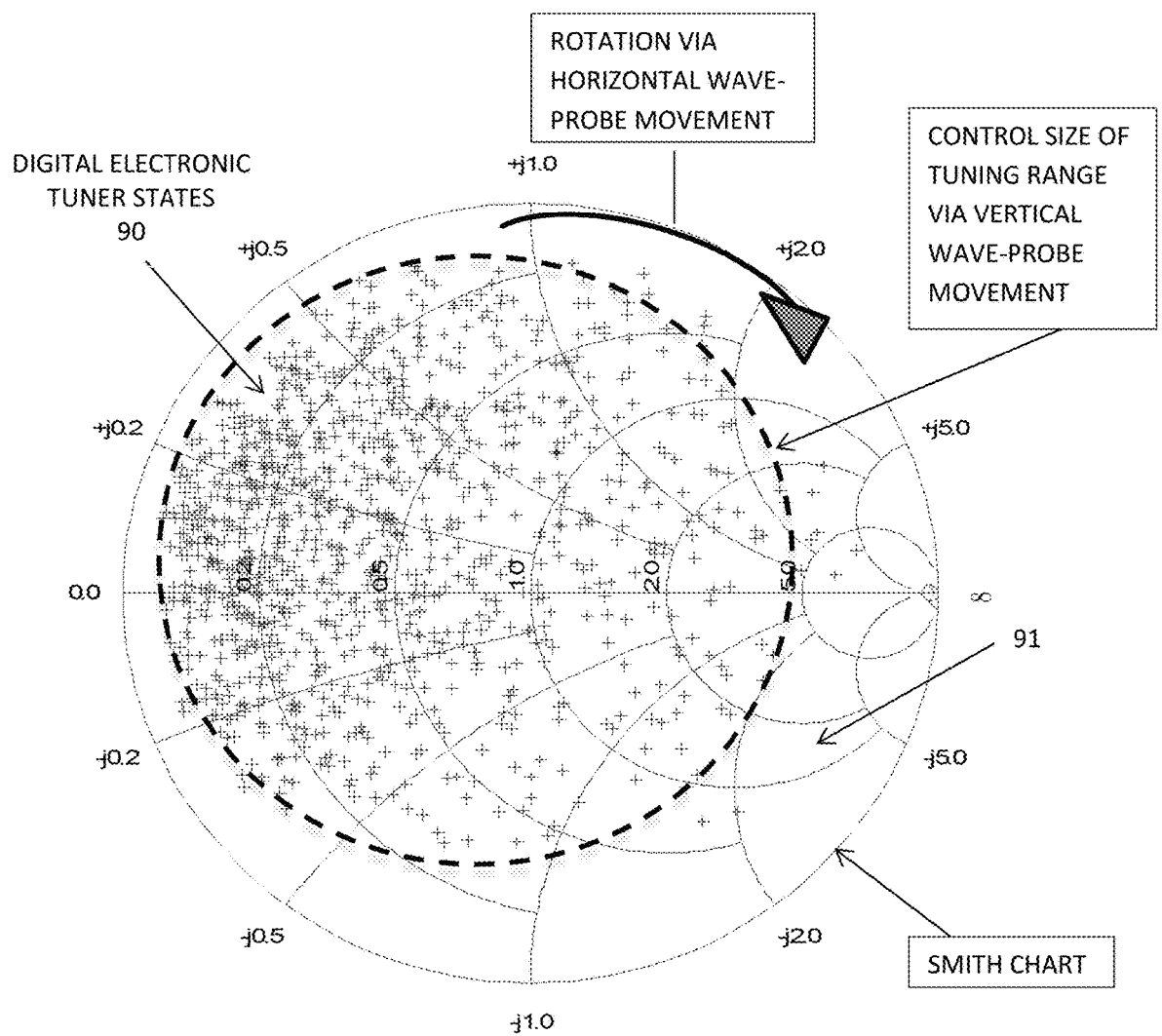
FIG. 9 depicts the 1024 tuning states of electronic tuner using 10 PIN diodes ($2^{10}$=1024 states).

The tuning mechanism is shown in FIG. 9. It shows the tuner states (90) of the digital electronic tuner of FIG. 10. Each point on the Smith chart corresponds to a different ON/OFF digital combination of the PIN diodes in the tuner. If N diodes are used we have $2^N$ combinations (N=8 results in 256 states, N=16 results in 65,536 states etc.). Such tuners typically use 12 diodes (4,096 states). However, since the distance between diodes is fixed, the reflection factors are not evenly distributed across the Smith chart, and, because diodes are not perfect short or open circuits when switched between ON and OFF states, there are always insertion losses, which reduce the maximum tuning range shown as a depleted area (91). The uneven impedance distribution creates the need to rotate the tuning area to match the DUT impedance. The active electronic tuner in this invention accomplishes this through the horizontal movement of the wave-probe as shown in FIG. 9. The size of the tuning range is controlled by the immersion of the wave-probe inside the slabline and the associated increasing coupling factor.

Obvious alternative embodiments are imaginable but shall not impede on the originality of the idea of using slabline based phase and amplitude adjustable signal coupling structure to create a hybrid (active-passive) electronic load pull tuner.

What I claim as my invention is:

1. An active electronic impedance tuner comprising an adjustable coupling module and an active tuning section,
    wherein the active tuning section comprises
        two circulators C1 and C2, each having three ports #1, #2 and #3,
        and a remotely controlled electronic tuner module,
        and an amplifier having input and output port;
    and wherein the adjustable coupling module comprises
        a slotted airline (slabline) having an input and an output port and a center conductor between the ports,
        and a directional coupler (wave-probe) remotely insertable into and sliding along the slabline and coupled to the center conductor,
    said wave-probe having a coupled and an isolated port;
    whereby the coupled port is connected to port #1 of C1 and the isolated port is terminated with characteristic impedance,
    and whereby port #2 of C1 is connected to the electronic tuner module and port #3 of C1 is connected to the input port of the amplifier;
    and whereby the output port of the amplifier is connected to port #1 of C2, port #2 of C2 is connected to the output port of the slabline and port #3 of C2 is connected to a load;
    whereby signal flow in the circulators is from port #1 to port #2, from port #2 to port #3 and from port #3 to port #1.

2. The tuner of claim 1,
    Whereby the electronic module comprises N (N>4) PIN diodes mounted along a microstrip transmission line and remotely switchable ON and OFF, thus creating a multitude of tuning states $M=2^N$.

3. The tuner of claim 1,
    whereby the wave-probe is attached to the remotely controlled vertical axis of a mobile carriage, said carriage sliding, remotely controlled, along the axis of the slabline.

4. The tuner of claim 1,
    whereby the wave-probe, the slabline, the circulators and the amplifier operate in the same frequency band.

5. The tuner as in claim 1, whereby a band pass filter is inserted in the active tuning section before the amplifier.

6. The tuner as in claim 1, whereby a band pass filter is inserted in the active tuning section between the coupled port and C1.

7. The tuner as in claim 1, whereby the circulator C2 is replaced by an Isolator.

* * * * *